United States Patent [19]
Murata et al.

[11] Patent Number: 6,060,731
[45] Date of Patent: May 9, 2000

[54] INSULATED-GATE SEMICONDUCTOR DEVICE HAVING A CONTACT REGION IN ELECTRICAL CONTACT WITH A BODY REGION AND A SOURCE REGION

[75] Inventors: Toshio Murata; Sachiko Kawaji; Takashi Suzuki; Tsutomu Uesugi, all of Aichi, Japan

[73] Assignee: Kabushiki Kaisha Toyota Chuo Kenkyusho, Aichi-gun, Japan

[21] Appl. No.: 09/122,800

[22] Filed: Jul. 27, 1998

[30] Foreign Application Priority Data

Jul. 28, 1997 [JP] Japan .................................. 9-217138

[51] Int. Cl.[7] .................................................. H01L 29/788
[52] U.S. Cl. .......................... 257/139; 257/220; 257/262; 257/263; 257/283; 257/329; 257/330; 257/332; 257/368; 257/370
[58] Field of Search ...................................... 257/220, 262, 257/263, 283, 329, 330, 332, 368, 370, 139

[56] References Cited

U.S. PATENT DOCUMENTS 5,917,751  6/1999  Wakita ..................................... 257/315

FOREIGN PATENT DOCUMENTS 58-137254  8/1983  Japan .

*Primary Examiner*—Fetsum Abraham
*Attorney, Agent, or Firm*—Oblon, Spivak, McClelland, Maier & Neustadt, P.C.

[57] ABSTRACT

A MOSFET wherein the formation of a channel in a channel formation region is controlled by a voltage applied to an insulated gate, comprising: a semiconductor substrate; a first semiconductor layer (drain region) of a first conductivity type formed on a surface of the semiconductor substrate; a second semiconductor layer (body region) of a second conductivity type provided within the first semiconductor layer, where a part thereof forms the channel formation region; a third semiconductor layer (source region) of the first conductivity type provided selectively in the second semiconductor layer; and a body contact region in electrical contact with the second semiconductor layer. The body contact region is formed in an area that is separated from an active region by a non-active region. With this structure, parasitic bipolar transistors operate simultaneously throughout the entire device so that a uniform breakdown current is generated, thus preventing element destruction due to current concentrations.

11 Claims, 10 Drawing Sheets

INSULATED-GATE SEMICONDUCTOR DEVICE HAVING A CONTACT REGION IN ELECTRICAL CONTACT WITH A BODY REGION AND A SOURCE REGION

BACKGROUND OF THE INVENTION

1. Field of the Invention

This invention relates to an insulated-gate type of semiconductor device and, in particular, to a technique of implementing a high avalanche capability in a power metal-oxide-semiconductor field-effect transistor (MOSFET).

2. Description of Related Art

When an inductive load is driven by a power MOSFET, the inductive counter electromotive force at turned-off (hereinafter called an "inductive kick") leads to breakdown of the power MOSFET, which is called avalanche failure. This avalanche breakdown occurs when parasitic bipolar transistors in the power MOSFET are activated by the breakdown current.

An example of a conventional vertical power MOSFET having trench gates is shown in FIGS. 10 and 11, where FIG. 10 is a partial plan view thereof without an insulated film over the source electrodes and trench gates and FIG. 11 is a partial cross-sectional view of essential components thereof.

This power MOSFET has an $n^+$-type semiconductor substrate 1 as well as an n-type epitaxial layer 2, a p-type body layer 3, an $n^+$-type source region 4, a gate insulated film 5, gate electrodes 6, a source electrode 7, and a drain electrode 8. In the source region 4, contact regions 9 for the body layer 3 are formed by exposed portions of the body layer 3 that are disposed as islands. In FIG. 11, reference symbol "$I_{ON}$" denotes an on current and "$I_B$" denotes the breakdown current generated when the MOSFET is turned off. Reference symbol "Q" denotes a parasitic npn bipolar transistor and reference symbol "$R_B$" denotes the parasitic resistance of the body layer 3.

When this MOSFET is turned off, the breakdown current $I_B$ flows because of the inductive kick. This breakdown current $I_B$ flows from the drain electrode 8 through the semiconductor substrate 1, the epitaxial layer 2, the body layer 3, and the contact regions 9 to the source electrode 7. During this time, if the voltage drop generated between the two ends of the resistance $R_B$ of the body layer 3 exceeds the voltage $V_{BE}$ between the base and emitter of each parasitic bipolar transistor Q, the parasitic bipolar transistor Q may turn on and an over-large breakdown current may concentrate through the transistor Q, so that junction destruction or melting of the silicon or the wiring may occur, resulting in the element destruction.

When power MOSFETs are used in automotive applications in particular, a large proportion of the vehicle-mounted loads are inductive loads due to motors or solenoid valves, so it is extremely important to avoid the danger of avalanche failure caused by inductive kicks.

Up to the present, various methods of suppressing the operation of these parasitic bipolar transistors have been taken to avoid this avalanche failure. More specifically, one of the following methods is used in n-channel power MOSFETs (by way of example) in order to reduce the resistance of the body layer that is equivalent of the base resistance of each parasitic bipolar transistor: (a) a deep, high-impurity concentration p-type diffused region is formed in the semiconductor layer between adjacent gate electrodes, or (b) the body layer is made to be deeper.

Of these conventional countermeasures, a method (a), in which a deep, high-impurity concentration p-type diffused region is formed between adjacent gate electrodes, has problems as discussed below.

1. Ordinarily, to form the p-type diffused region so as to surround an n-type source region that has a higher impurity concentration than the P-type diffused region, it is necessary to secure a sufficiently large surface area for the p-type region from consideration of possible lateral diffusion of the n-type impurity forming the source region. This means that the method (a) limits a reduction in size of the element and prevents any reduction in the on-resistance of the power MOSFET.

2. If the impurity of the p-type diffusion region is diffused as far as the channel region formed in the immediate vicinity of the gate electrode, the threshold voltage of the power MOSFET will increase. For that reason, the method (a) limits a reduction in size of the element and prevents any reduction in the on-resistance (drain-source on-state resistance) of the power MOSFET, in a similar manner to the above.

A method (b), in which the body layer is made deeper, also has problems as discussed below.

3. If the body layer is deeper in a vertical power MOSFET having trench gates, this leads directly to an increase in the channel length, which leads to an increase in the channel resistance, in other words, the on-resistance. With a vertical power MOSFET of a planar gate structure, deepening the body layer causes broadening in both the depthwise direction and the widthwise direction, which leads to an increase in the channel resistance, in other words, the on-resistance.

There is thus a trade-off in the conventional structure between reducing the on-resistance and increasing the avalanche capability, and it is difficult for the conventional structure of a device to satisfy these two requirements adequately.

SUMMARY OF THE INVENTION

An objective of this invention is to provide an insulated-gate semiconductor device that is capable of achieving a high avalanche capability, without any increase in the on-resistance of the device.

According to the present invention, there is provided an insulated-gate semiconductor device for controlling the formation of a channel in a channel formation region by a voltage applied to an insulated gate, the insulated-gate semiconductor device comprising:

a semiconductor substrate;

a first semiconductor layer of a first conductivity type formed on a surface of the semiconductor substrate;

a second semiconductor layer of a second conductivity type provided in the first semiconductor layer and forming a body region, where the channel formation region is formed within part of the body region;

a third semiconductor layer of the first conductivity type, provided in the second semiconductor layer and forming a source region; and a contact region in electrical contact with the second semiconductor layer;

wherein the contact region is formed in a region except an active region.

The avalanche failure that occurs when an inductive load is driven caused by the activation of a parasitic bipolar transistor in an insulated-gate semiconductor device (such as a power MOSFET). More specifically, this phenomenon occurs because this parasitic bipolar transistor operates non-uniformly within the chip of the device, as a result the breakdown voltage drops only within the region in which the parasitic bipolar transistor operates, and the current concentration in that region causes avalanche failure.

As discussed previously, various methods are used in the conventional structure to ensure that the parasitic bipolar transistor that is inherent in a power MOSFET does not operate, in order to implement a high avalanche capability. However, this invention goes against the conventional idea by causing parasitic bipolar transistors to operate uniformly throughout the entire device (chip) to suppress the current concentration phenomenon by lowering the breakdown voltage of the entire device, thus making it possible to implement a high avalanche capability.

More specifically, this invention has a structure in which no contact region for electrode extraction from the body region (the second semiconductor layer) is formed in an active region, and contact is made at a portion except an active region. In this case, "active region" means a region comprising a portion for forming the channel region, including at least the gate electrode.

There are two structures for making contact with the body region in a portion that differs from the active region: (a) a structure in which electrical contact with the body region is formed through a non-active region and (b) a structure in which electrical contact is formed by close contact with the active region, without the intervention of a non-active region.

That is to say, putting the body region in a completely floating state lowers the DC breakdown voltage and destabilizes the potential of the channel region to impede the operation of the transistor. Therefore, a contact region for the body region (hereinafter called a "body contact region") could be formed either at a location that is sufficiently separated from the active region by the non-active region, such as on the periphery of the chip, or in close contact with the active region. And Electrical contact with the body region is made in the body contact region.

When an inductive load is driven by MOSFET, an inductive kick is generated at the instant of switch-off, causing avalanche breakdown in the power MOSFET. The present inventors have made it clear by investigations including simulations that the region in which this avalanche breakdown occurs is in the neighborhood of the gate electrode through which a current was flowing immediately before the power MOSFET was turned off.

The breakdown current flows through a body region 20 located below a source region 30 and into a body contact region 50, as shown in the example of FIG. 3. At this point, if the breakdown current is denoted by "$I_B$" and the resistance of the region between the active region and the body contact region, in other words, the non-active region, is denoted by "$R_B$", the voltage drop $V_B$ created by this flow of breakdown current is given by: $I_B \times R_B$. If this voltage drop $V_B$ is greater than the junction potential $V_C$ formed between the source region and the body region (usually approximately 0.6 to 0.7 V at room temperature), the parasitic bipolar transistors are activated and the breakdown voltage drops. The breakdown current flows from the entire region in which the gate electrode is formed (the active region) into the body contact region.

That is to say, if the voltage drop $V_B$ generated by the breakdown current in the non-active region is greater than the junction potential $V_C$ between the source region and the body region, parasitic bipolar transistor operate substantially simultaneously throughout the entire device, and thus breakdown occurs uniformly over the entire device. As a result, it is possible to avoid element destruction caused by concentrations of the breakdown current.

In another aspect of this invention, the body contact region could be provided adjacent to the active region, instead of with the non-active region therebetween as described above. For example, as shown in FIG. 13, the voltage drop due to the breakdown current could be induced in the active region, to ensure that the parasitic bipolar transistors operate uniformly throughout the entire device.

In this manner, it is important in the present invention to set the magnitude of the voltage drop in the body region for the operation of the parasitic bipolar transistors to be greater than the junction potential between the source region and the body region. The magnitude of this voltage drop depends on the impurity concentration and depth of the body region and also the distance in the direction along which the breakdown current flows.

The entire top surface of the non-active region in view of an element design and a process of this invention is preferably covered by the source region layer. It should be obvious that the breakdown voltage of the device during the voltage drop due to the breakdown current is set to be sufficiently large.

This body contact region is preferably formed of an impurity diffusion layer comprising a high concentration of an impurity of a second conductivity type, formed continuously from the body region.

DETAILED DESCRIPTION OF PREFERRED EMBODIMENTS

First Embodiment

Figure 1:
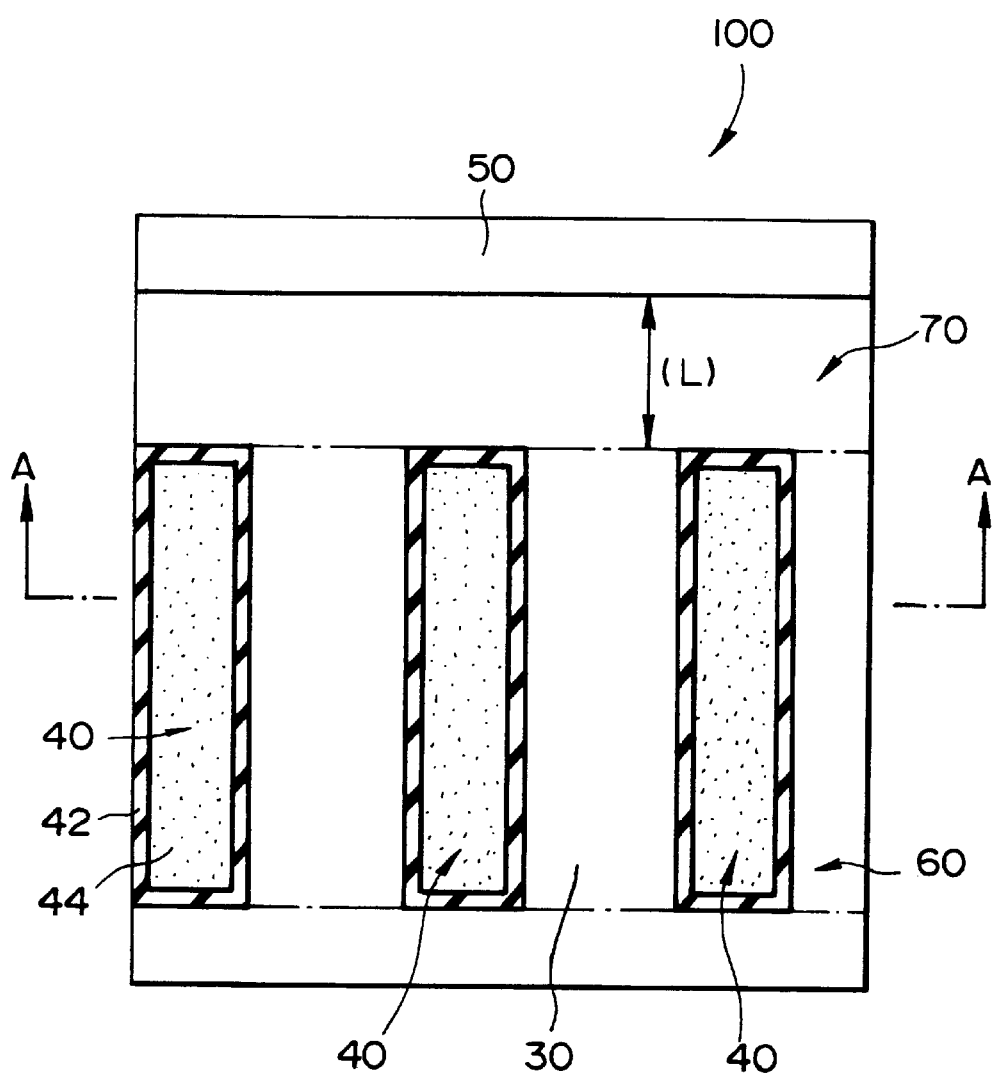
FIG. 1 is a partial plan view of a power MOSFET in accordance with a first embodiment of this invention.
Figure 2:
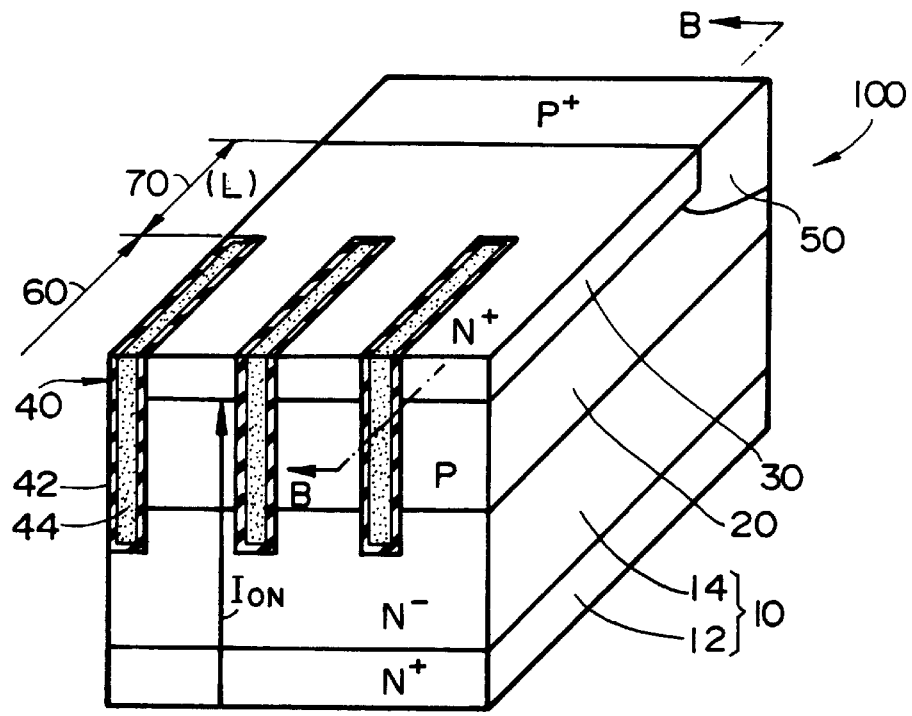
FIG. 2 is a cutaway perspective view taken along the line A—A in FIG. 1.
Figure 3:
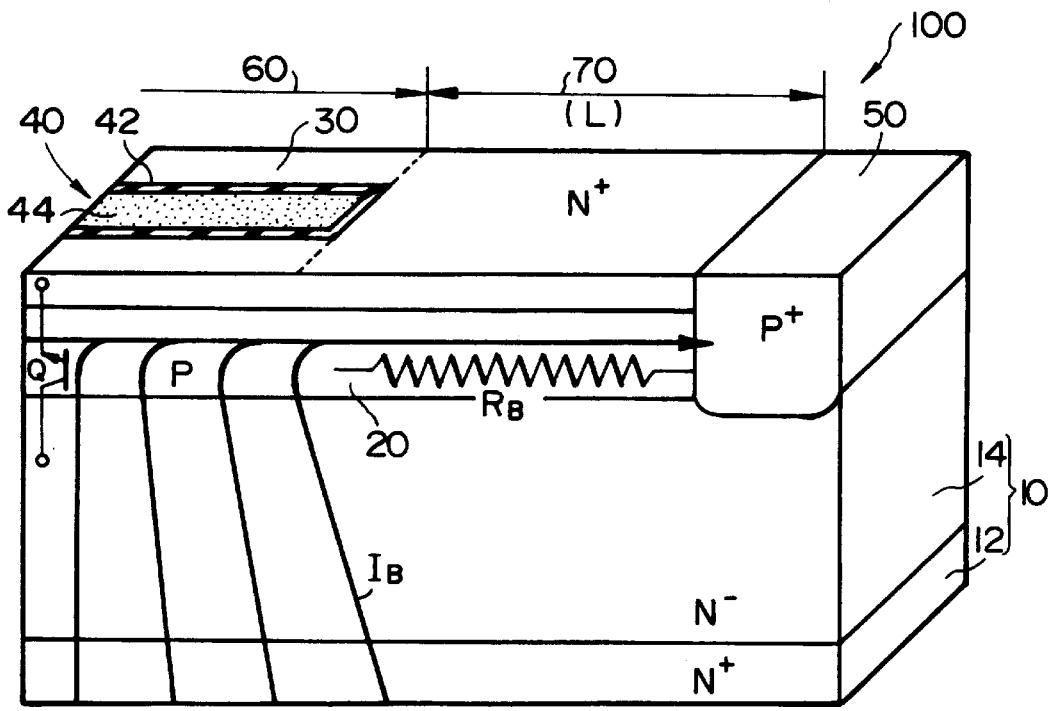
FIG. 3 is a partial cutaway perspective view taken along the line B—B in FIG. 2.

An example of this invention applied to a vertical power MOSFET having trench gates is shown in FIGS. 1 to 3. FIG.

1 is a partial plan view of a MOSFET 100 relating to this embodiment, FIG. 2 is a cutaway perspective view taken along the line A—A of FIG. 1, and FIG. 3 is a cutaway perspective view taken along the line B—B of FIG. 2.

This MOSFET 100 has an n$^+$-type semiconductor substrate 12, which comprises a high concentration of an n-type impurity, and an n$^-$-type semiconductor layer 14, which is formed by an epitaxial growth method or the like on top of the semiconductor substrate 12 and comprises a low concentration of an n-type impurity. The semiconductor substrate 12 and semiconductor layer 14 together form a drain region 10. A p-type body region 20 is formed in the n$^-$-type semiconductor layer 14 by the diffusion of a p-type impurity. A source region 30 is formed in the body region 20 by the selective diffusion of a high concentration of an n-type impurity. A plurality of trench gates 40 are provided in stripes formed so as to penetrate through the source region 30, the body region 20, and part of the semiconductor layer 14. Each of the trench gates 40 is formed of a gate insulated film 42 located on the outer side thereof and a gate electrode 44 comprising a substance such as polysilicon filling the inside of the gate insulated film 42.

This embodiment of the invention is characterized in that a body contact region 50 that provides electrical contact with the body region 20 is formed as a continuous stripe that is located at a predetermined distance (L) from edge portions of the trench gates 40. The region that separates the trench gates 40 from the body contact region 50 is called a non-active region 70. In addition, the source region 30 in this embodiment is formed over the entire surface of an active region 60, in which the trench gates 40 are formed, and the non-active region 70, and the source region layer ensures that there are no exposed portions of the p-type body region 20.

This non-active region 70 satisfies at least the conditions discussed below. If the resistance of the p-type body region 20 in the non-active region 70 of FIG. 3 is assumed to be $R_B$ and the breakdown current thereof when the element is turned off is assumed to be $I_B$, the voltage drop $V_B$ of the body region 20 in the non-active region 70 is given by: $I_B \times R_B$. This voltage drop $V_B$ is set to be greater than the junction potential $V_C$ between the n$^+$-type source region 30 and the p-type body region 20 (usually approximately 0.6 to 0.7 V at room temperature).

The provision of the non-active region 70 in this manner ensures that, when an inductive load is driven, the breakdown current $I_B$ generated by the inductive kick when the device is turned off flows substantially uniformly through the entire device, thus making it possible to avoid element destruction due to current concentrations. In other words, if the minimum voltage drop $V_B$ due to the breakdown current $I_B$ in the non-active region 70 becomes greater than the junction potential $V_C$ between the source region 30 and the body region 20, parasitic bipolar transistors Q operate simultaneously, thus causing a reduction in the breakdown voltage within the entire device. In addition, since the breakdown current flows from the entire active region 60 towards the body contact region 50, the breakdown current flows uniformly through the entire device.

Note that when this device is turned on, it operates in a similar manner to an ordinary vertical power MOSFET. That is to say, a channel region is formed in the body region 20 of this MOSFET 100 by controlling the voltage applied to the gate electrodes 44, the source region 30 and drain region 10 are made conductive as a result, and thus the drain current $I_{ON}$ flows vertically therethrough.

In this manner, the power MOSFET 100 of this embodiment of the invention ensures that parasitic bipolar transistors operate uniformly and also simultaneously throughout the entire device (chip) when an inductive load is driven thereby, so that there is no element destruction due to current concentrations, a high avalanche capability can be implemented, and there is also no resultant increase in the on-resistance.

Figure 5:
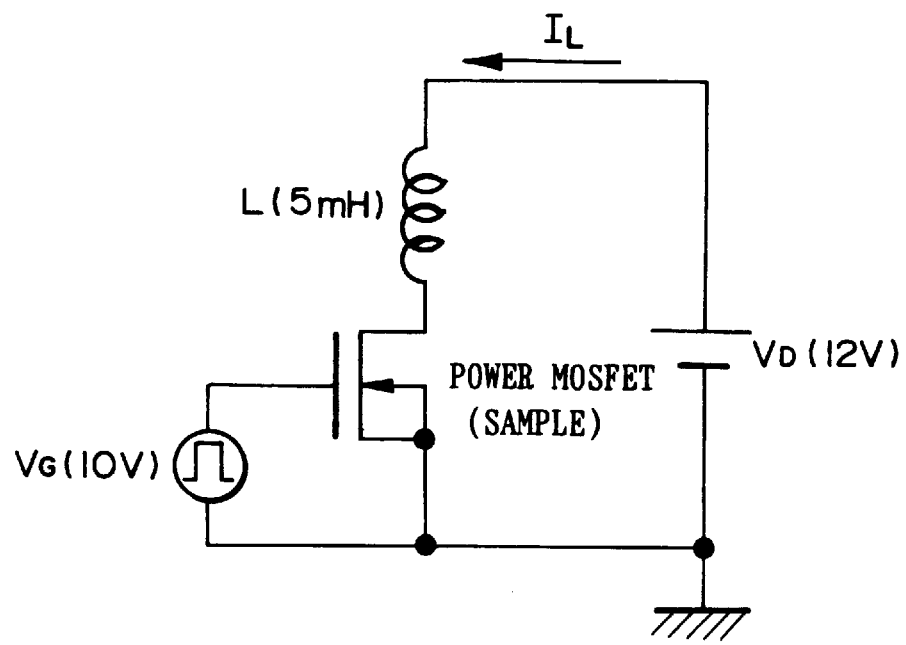
FIG. 5 shows a test circuit used in the experiments on avalanche capability shown in FIG. 4.
Figure 6:
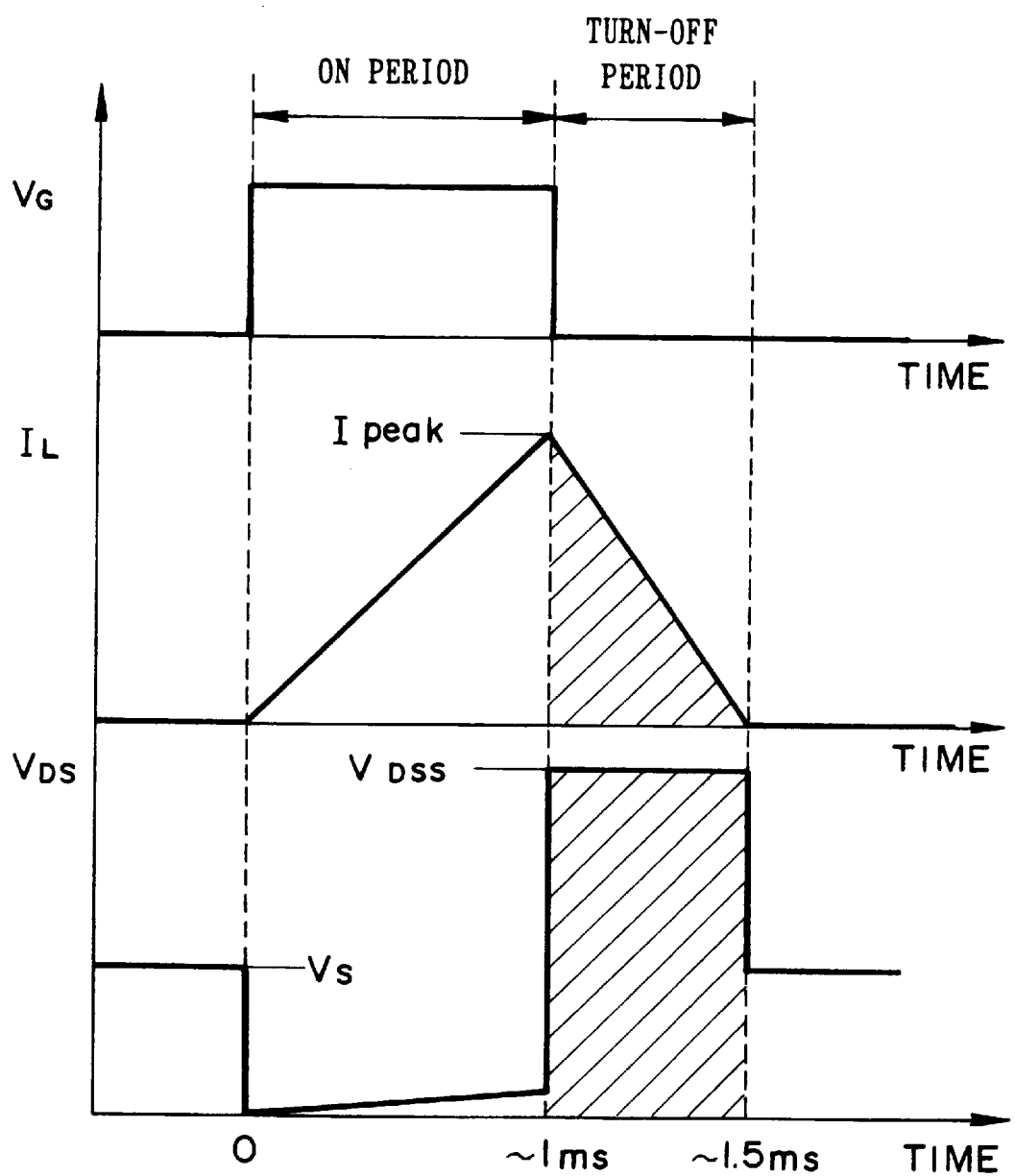
FIG. 6 shows transient characteristics in load current and element voltage obtained during the experiments on avalanche capability shown in FIG. 4.

Experiments were performed to verify the improvement in avalanche capability of this embodiment, with the results as described below. The test circuit shown in FIG. 5 was used during these experiments. The transient characteristics in load current ($I_L$), gate voltage ($V_G$), and drain-source voltage ($V_{DS}$) observed during these experiments are shown in FIG. 6.

The method described below was used for these experiments.

1. The on-time of the gate drive was set in such a manner that a predetermined load current flowed. This load current increases linearly with respect to the gate on-time (see FIG. 6).
2. The gate was turned off when the load current had reached a predetermined value.
3. After the element was turned off (after avalanche breakdown had ended), the breakdown voltage of the element was measured and destruction was determined to have occurred if that value was lower than a predetermined value.

Note that the avalanche capability Ea is defined by the following equation:

$$Ea = (\tfrac{1}{2}) L I_{peak}^2 \; (V_{DSS}/(V_{DSS}-V_D))$$

where:

L: The inductance of the load
$I_{peak}$: The load current immediately before turn-off
$V_{DSS}$: The breakdown voltage of the element
$V_D$: The power source voltage The chip size of the devices used in these experiments was 3 mm×3 mm.

Figure 4:
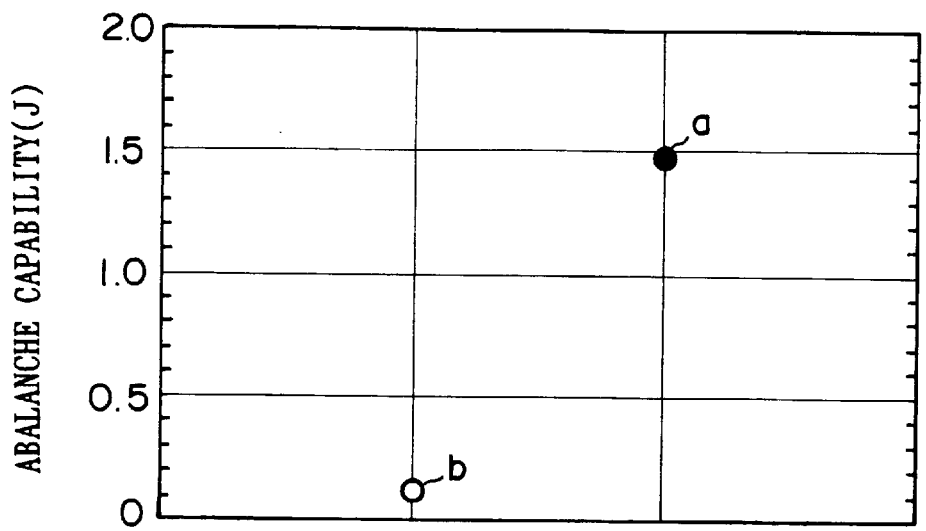
FIG. 4 is a graph of the results of experiments on avalanche capability, measured in the device in accordance with the first embodiment and a device of the conventional structure.
Figure 10:
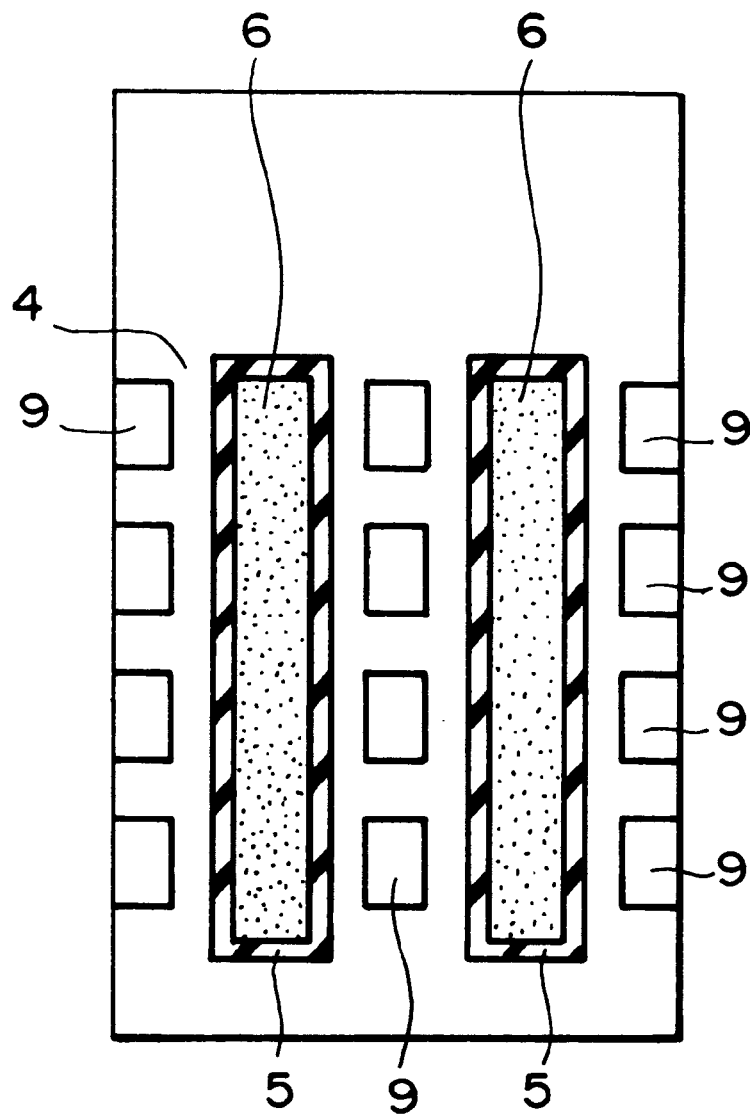
FIG. 10 is a partial plan view of a vertical power MOSFET having conventional trench gates.
Figure 11:
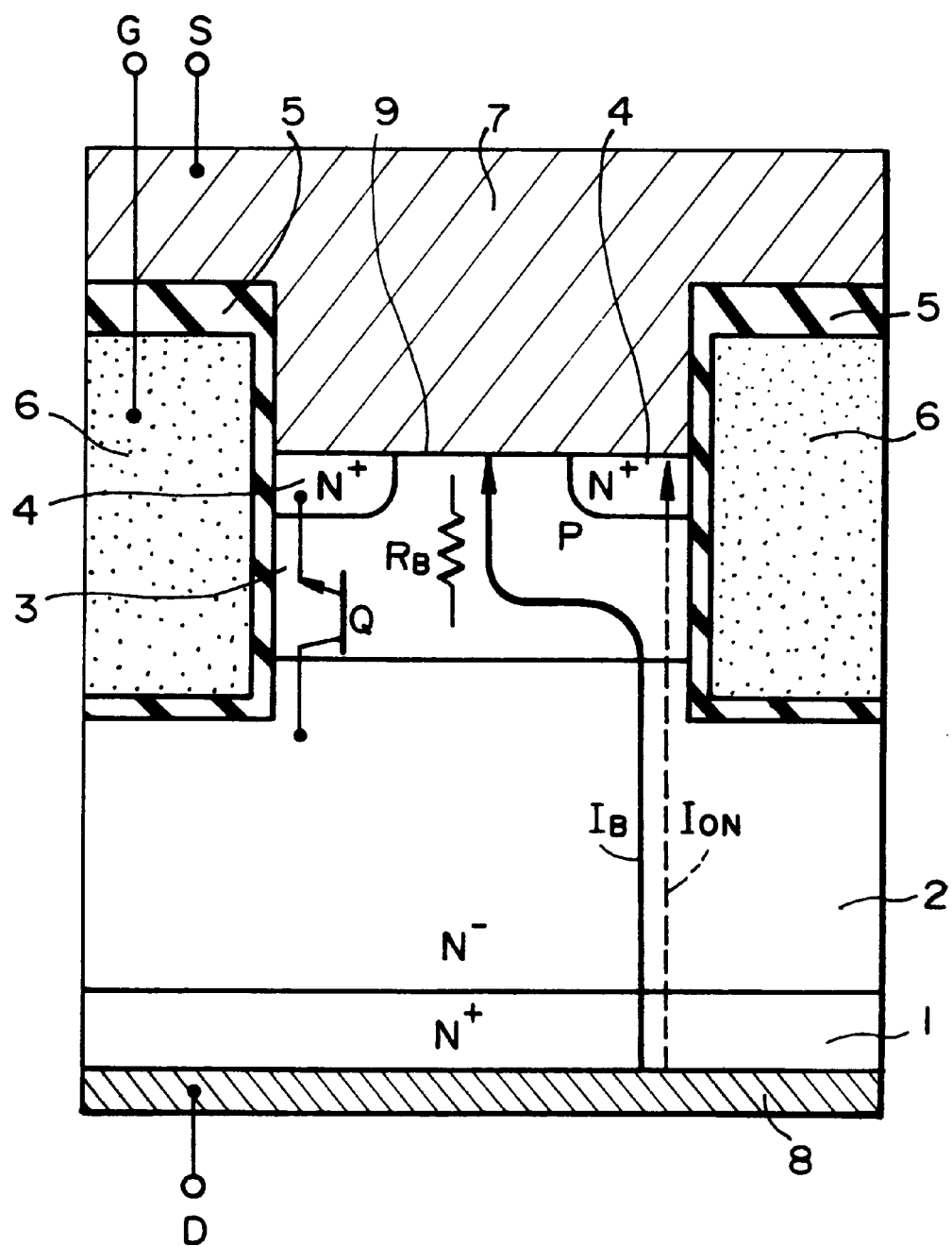
FIG. 11 is a cross-sectional view of essential components of the MOSFET of FIG. 10.

Similar measurements were made of a MOSFET of a conventional structure which is similar to that of the above sample, except that the body contact region 9 was formed between the gate electrodes 6, as shown in FIG. 10. These results are shown in FIG. 4. In FIG. 4, the point denoted by reference symbol "a" refers to measurement results obtained for the device in accordance with this embodiment and the point denoted by reference symbol "b" refers to measurement results obtained for the device of the conventional structure.

It can be seen from FIG. 4 that the avalanche capability that was obtained for the device in accordance with this embodiment was an order of magnitude greater than (or fifteen times) that for the device of the conventional structure.

Second Embodiment

Figure 7:
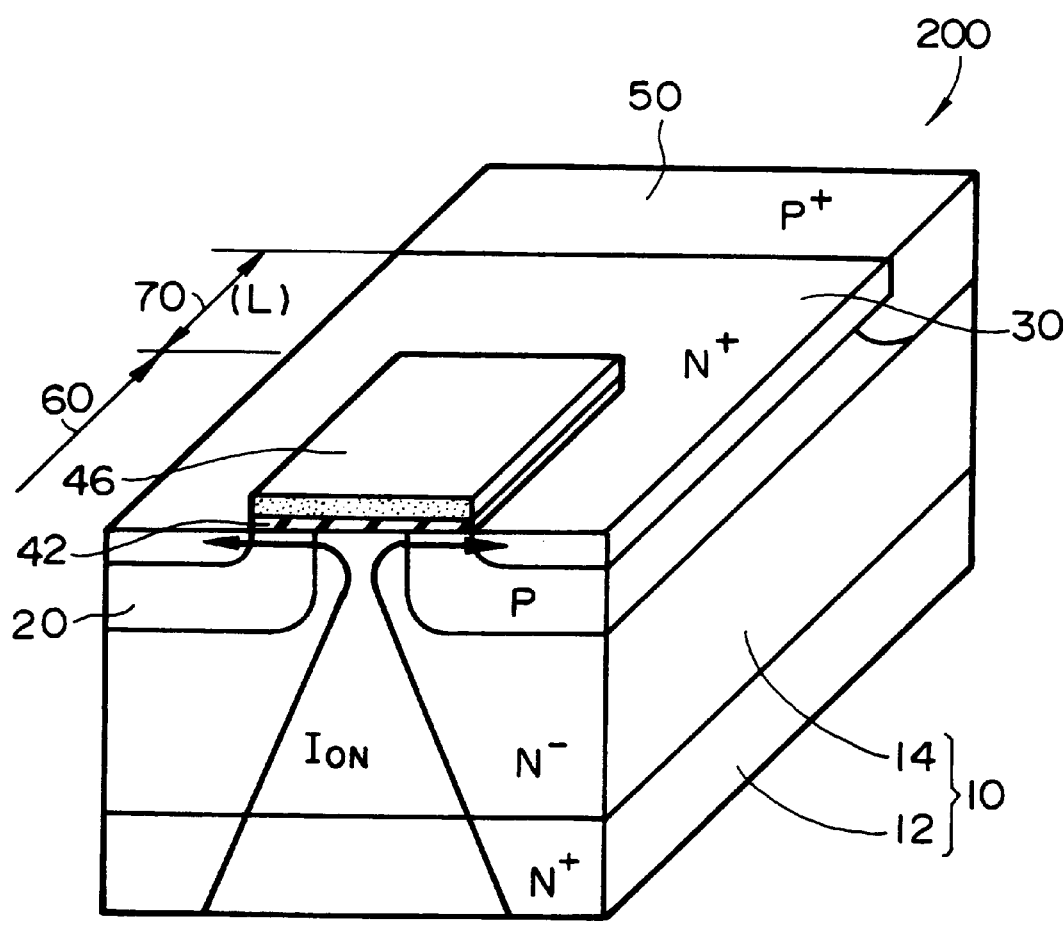
FIG. 7 is a schematic cutaway perspective view of essential components of a planar vertical power MOSFET in accordance with a second embodiment of this invention.

A cutaway perspective view of an example of this invention applied to a planar vertical power MOSFET is shown in FIG. 7.

A MOSFET 200 of this embodiment has basically the same structure as that of the first embodiment, except for the gate electrode structure.

In other words, this MOSFET 200 has the drain region 10, which includes the n$^+$-type semiconductor substrate 12 comprising a high concentration of an n-type impurity and the n$^-$-type semiconductor layer 14 formed-on the semiconductor substrate 12 and comprising a low concentration of an n-type impurity; the p-type body region 20 formed in the n⁻-type semiconductor layer 14; the source region 30 formed in the body region 20; and a gate electrode 46 formed over the gate insulated film 42.

The body contact region 50 for providing electrical contact with the body region 20 is formed to be located at a predetermined distance (L) from an edge portion of the gate electrode 46. In a manner similar to that of the above first embodiment, the minimum voltage drop $V_B$ of the body region 20 in the non-active region 70 that separates the gate electrode 46 (the active region 60) from the body contact region 50 is set to be greater than the junction potential $V_C$ between the n⁺-type source region 30 and the p-type body region 20.

The provision of the non-active region 70 in this manner ensures that, when an inductive load is driven, the breakdown current generated by the inductive kick thereof flows uniformly through the entire device, making it possible to avoid element destruction due to current concentrations. The reasons therefor are the same as those described above with respect to the first embodiment, so are omitted here. The operation when the element is turned on is also similar to that of the first embodiment. In other words, a channel region is formed in the body region 20 of this MOSFET 200 by controlling the voltage applied to the gate electrode 46, the source region 30 and drain region 10 are made conductive, and thus the drain current $I_{ON}$ flows vertically therethrough.

In this manner, the power MOSFET 200 of this embodiment of the invention ensures that parasitic bipolar transistors operate uniformly and also simultaneously throughout the entire device when an inductive load is driven thereby, so that there is no element destruction due to current concentrations, a high avalanche capability can be implemented, and there is also no resultant increase in the on-resistance.

Third Embodiment

Figure 8:
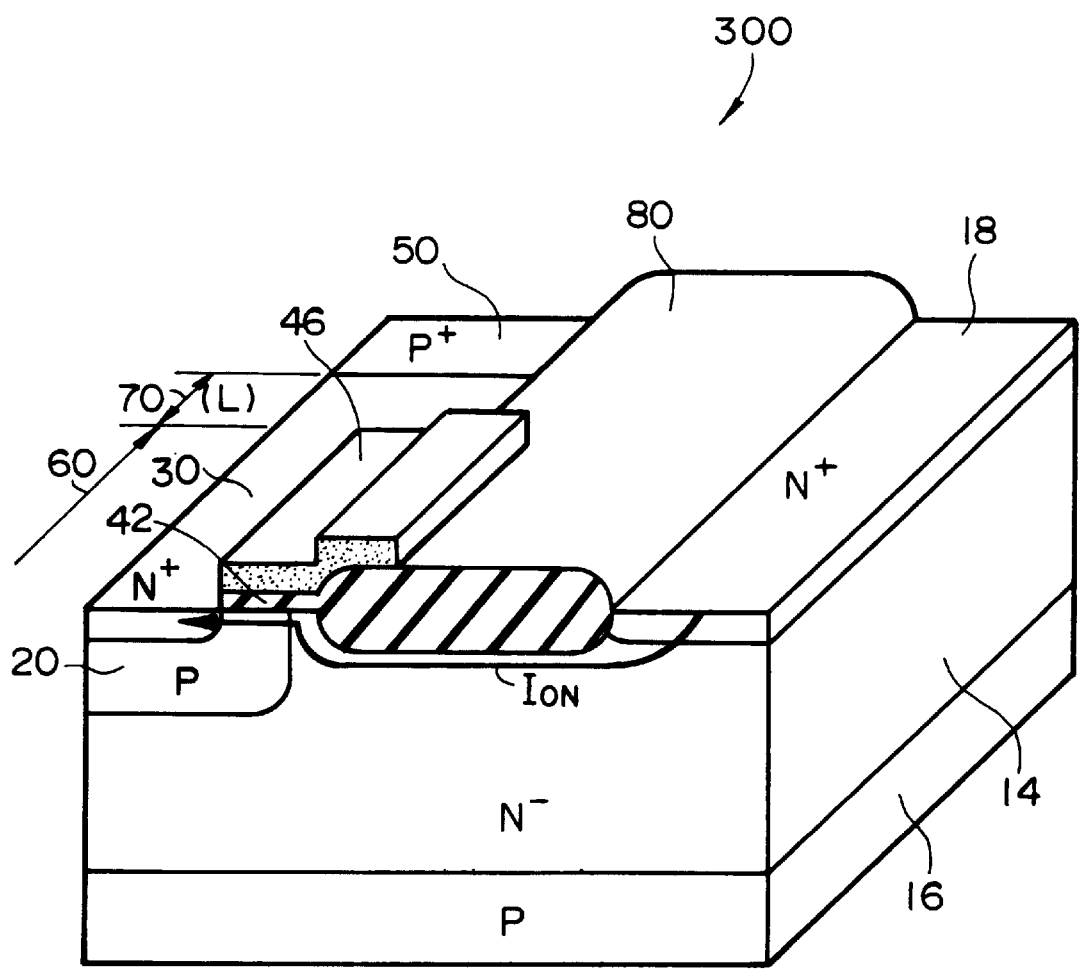
FIG. 8 is a schematic cutaway perspective view of a planar horizontal power MOSFET in accordance with a third embodiment of this invention.

A cutaway perspective view of an example in which this invention is applied to a planar lateral power MOSFET is shown in FIG. 8.

A MOSFET 300 of this embodiment has basically the same structure as that of the first embodiment, except that the current flows laterally in the element and the gate electrode is planar structure.

In other words, this MOSFET 300 has a p-type semiconductor substrate 16; the n⁻-type semiconductor layer 14 which functions as a drift layer, is formed on the semiconductor substrate 16, and comprises a low concentration of an n-type impurity; the p-type body region 20 formed in the n⁻-type semiconductor layer 14; the source region 30 formed in the body region 20; the gate electrode 46 formed over the gate insulated film 42, and a drain region 18 formed in the n⁻-type semiconductor layer 14. The source region 30 and the drain region 18 are insulated from each other by a field oxide film 80.

The body contact region 50 for providing electrical contact with the body region 20 is formed to be located at a predetermined distance (L) from an edge portion of the gate electrode 46. In a manner similar to that of the above first embodiment, the minimum voltage drop $V_B$ of the body region 20 in the non-active region 70 that separates the gate electrode 46 (the active region 60) from the body contact region 50 is set to be greater than the junction potential $V_C$ between the n⁺-type source region 30 and the p-type body region 20

The formation of the non-active region 70 in this manner ensures that, when an inductive load is driven, the breakdown current generated by the inductive kick thereof flows uniformly through the entire device, making it possible to avoid element destruction due to current concentrations. The reasons therefor are the same as those described above with respect to the first embodiment, so are omitted here. In addition, when the device is turned on, a channel region is formed in the body region 20 of this MOSFET 300 by controlling the voltage applied to the gate electrode 46, the source region 30 and drain region 18 are made conductive, and thus the drain current $I_{ON}$ flows laterally therethrough.

In this manner, the power MOSFET 300 of this embodiment of the invention ensures that parasitic bipolar transistors operate uniformly and also simultaneously throughout the entire device when an inductive load is driven thereby, so that there is no element destruction due to current concentrations, a high avalanche capability can be implemented, and there is also no resultant increase in the on-resistance.

Fourth Embodiment

Figure 9:
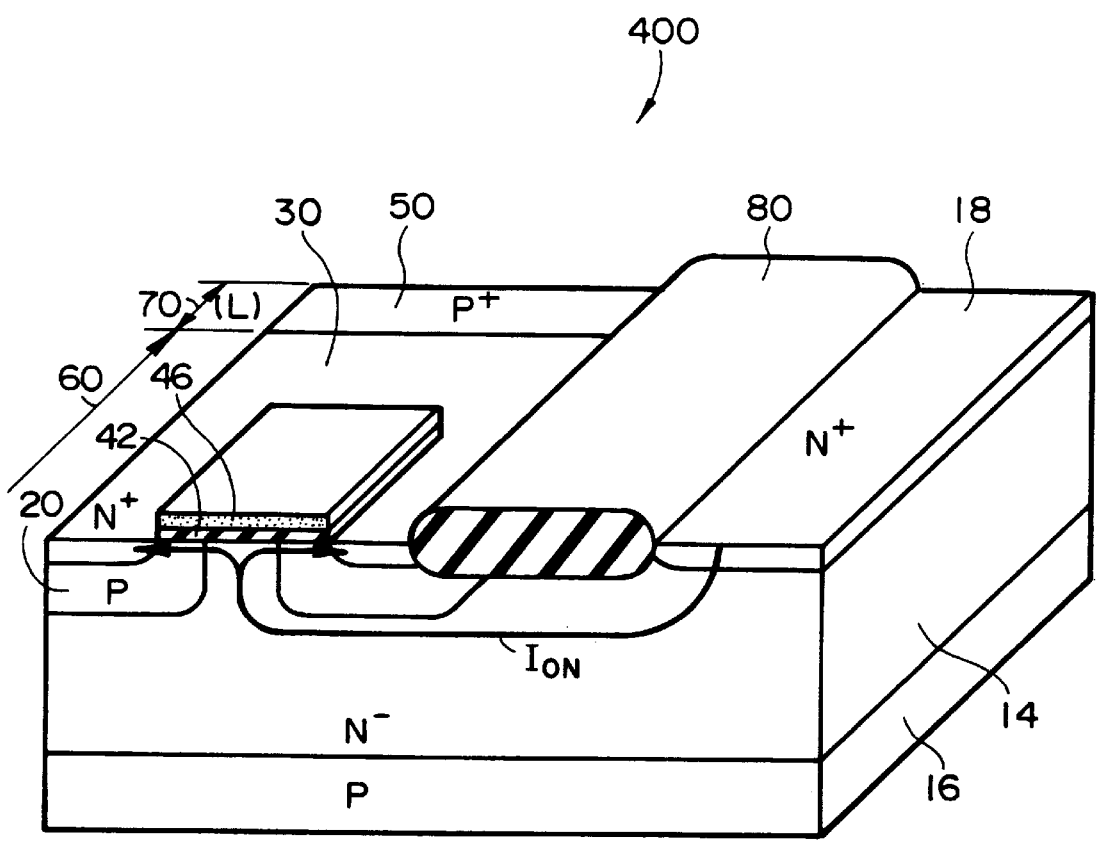
FIG. 9 is a schematic cutaway perspective view of a planar up-drain vertical power MOSFET in accordance with a fourth embodiment of this invention.

A cutaway perspective view of an example of this invention applied to a planar up-drain vertical power MOSFET is shown in FIG. 9.

A MOSFET 400 of this embodiment has basically the same structure as that of the first embodiment, with the main differences being the structure of the gate electrode and drain region.

In other words, this MOSFET 400 has the p-type semiconductor substrate 16; the n⁻-type semiconductor layer 14 which functions as a drift layer, is formed on the semiconductor substrate 16, and comprises a low concentration of an n-type impurity; the p-type body region 20 formed in the n⁻-type semiconductor layer 14; the source region 30 formed in, the body region 20; the gate electrode 46 formed over the gate insulated film 42, and the drain region 18 formed in the n⁻-type semiconductor layer 14. The source region 30 and the drain region 18 are insulated from each other by the field oxide film 80. The device of this embodiment differs from that of the third embodiment in that it has a structure where the gate electrode 46 is surrounded by the source region 30.

The body contact region 50 for providing electrical contact with the body region 20 is formed to be located at a predetermined distance (L) from an edge portion of the gate electrode 46. In a manner similar to that of the above first embodiment, the minimum voltage drop $V_B$ of the body region 20 in the non-active region 70 that separates the gate electrode 46 (the active region 60) from the body contact region 50 is set to be greater than the junction potential $V_C$ between the n⁺-type source region 30 and the p-type body region 20.

The formation of the non-active region 70 in this manner ensures that, when an inductive load is driven, the breakdown current generated by the inductive kick thereof flows uniformly through the entire device, making it possible to avoid element destruction due to current concentrations. The reasons therefor are the same as those described above with respect to the first embodiment, so are omitted here. In addition, when this MOSFET 400 is switched on, a channel region is formed in the body region 20 by controlling the voltage applied to the gate electrode 46, the source region 30 and drain region 10 are made conductive, and thus the drain current $I_{ON}$ flows vertically, laterally, then vertically, detouring around the body region 20.

In this manner, the power MOSFET 400 of this embodiment of the invention ensures that parasitic bipolar transistors operate uniformly and also simultaneously throughout the entire device when an inductive load is driven thereby, so that there is no element destruction due to current concentrations, a high avalanche capability can be implemented, and there is also no resultant increase in the on-resistance.

Fifth Embodiment

Figure 12:
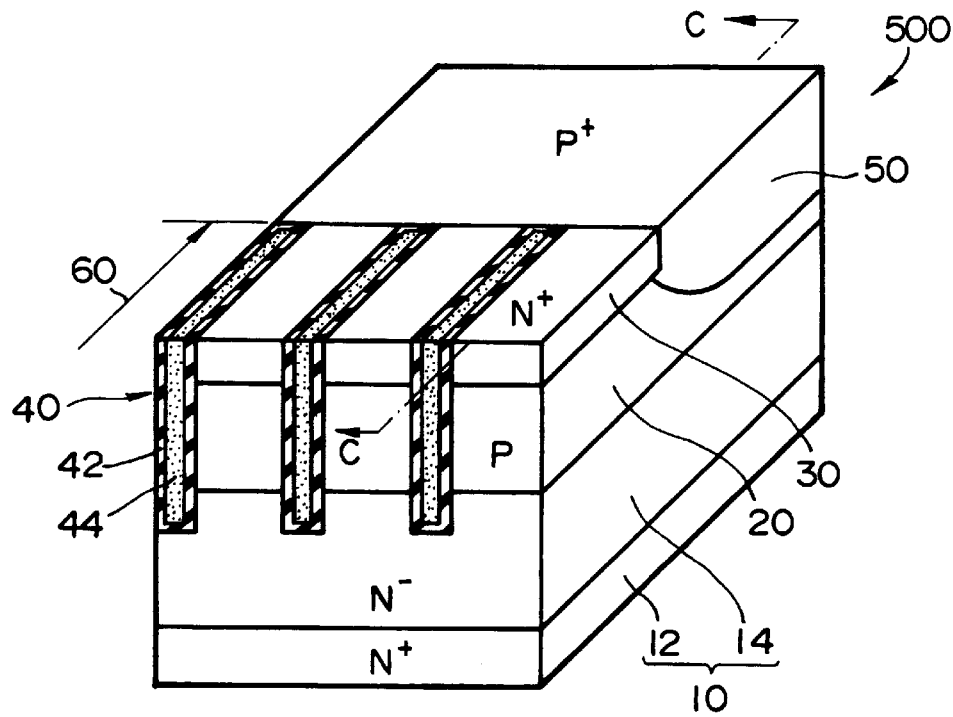
FIG. 12 is a cutaway perspective view of a power MOSFET of a fifth embodiment of this invention.
Figure 13:
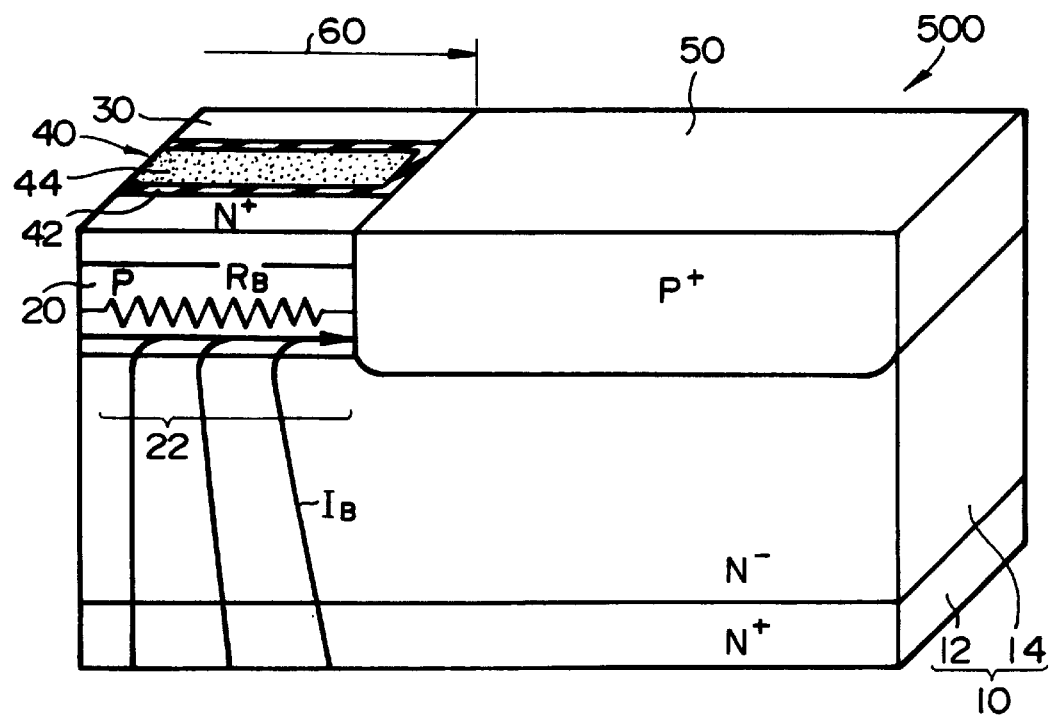
FIG. 13 is a partial cutaway perspective view taken along the line C—C of FIG. 12.

An example of this invention applied to a vertical power MOSFET having a trench gate structure is shown in FIGS. 12 and 13. FIG. 12 is a cutaway perspective view showing essential components of this embodiment in a schematic manner, and FIG. 13 is a cutaway perspective view taken along the line C—C of FIG. 12.

A MOSFET 500 of this embodiment has basically the same structure as that of the first embodiment, except the non-active region 70 between the active region 60 and the body contact region 50. In other words, it has the n$^+$-type semiconductor substrate 12, which comprises a high concentration of an n-type impurity, and the n$^-$-type semiconductor layer 14, which is formed by an epitaxial growth method or the like on top of the semiconductor substrate 12 and comprises a low concentration of an n-type impurity. The semiconductor substrate 12 and semiconductor layer 14 together form the drain region 10. The p-type body region 20 is formed in the n$^-$-type semiconductor layer 14 by the diffusion of p-type impurity. The source region 30 is formed in the body region 20 by the selective diffusion of a high concentration of an n-type impurity. A plurality of the trench gates 40 are provided in stripes formed so as to penetrate through the source region 30, the body region 20, and part of the n$^-$-type semiconductor layer 14. Each of the trench gates 40 is formed of a gate insulated film 42 located on the outer side thereof and a gate electrode 44 comprising a substance such as polysilicon filling the inside of the gate insulated film 42.

This embodiment is characterized in that the body contact region 50 is formed in contact with the active region 60, to ensure electrical contact with the body region 20. This embodiment satisfies at least the conditions described below. As shown in FIG. 13, if the resistance of a region for turning the parasitic bipolar transistors on (hereinafter called a "voltage drop region") within the body region 20 in contact with the body contact region 50 is assumed to be $R_B$ and the breakdown current when the element is turned off is assumed to be $I_B$, the voltage drop $V_B$ in this voltage drop region 22 is given by: $I_B \times R_B$. This voltage drop $V_B$ is set to be greater than the junction potential $V_C$ between the n$^+$-type source region 30 and the p-type body region 20.

The formation of the voltage drop region 22 in this manner ensures that, when an inductive load is driven, the breakdown current $I_B$ generated by the inductive kick when the device is turned off flows substantially uniformly through the entire device, thus making it possible to avoid element destruction due to current concentrations. In other words, if the minimum voltage drop $V_B$ due to the breakdown current $I_B$ in the voltage drop region 22 becomes greater than the junction potential $V_C$ between the source region 30 and the body region 20, parasitic bipolar transistors operate substantially simultaneously, thus causing a reduction in the breakdown voltage within the entire device. In addition, since the breakdown current flows from the entire active region 60 towards the body contact region 50, the breakdown current flows uniformly through the entire device.

Note that when this device is turned on, it operates in a similar manner to an ordinary vertical power MOSFET. In other words, a channel region is formed in the body region 20 of this MOSFET 500 by controlling the voltage applied to the gate electrode 44, the source region 30 and drain region 10 are made conductive as a result, and thus the drain current $I_{ON}$ flows vertically therethrough.

In this manner, the power MOSFET 500 of this embodiment of the invention ensures that parasitic bipolar transistors operate uniformly and also simultaneously throughout the entire device (chip) when an inductive load is driven thereby, so that there is no element destruction due to current concentrations, a high avalanche capability can be implemented, and there is also no resultant increase in the on-resistance.

The structure of this fifth embodiment can also be applied to the MOSFETs described above with respect to the second to fourth embodiments. In other words, operations similar to those of the fifth embodiment can be achieved by the devices of the second to fourth embodiments, even if they are configured without the non-active region and with the active region and the body contact region in contact.

The element structure of this invention makes it possible to make the width of the active region between adjacent gate electrodes very narrow because a contact region for electrode extraction from the body region is not formed in an active region. More specifically, although it is difficult to reduce the width of the active region between adjacent gate electrodes in the conventional structure to 3 μm or less, the element structure of this invention makes it possible to implement a width of 1 μm or less in the active region between adjacent gate electrodes.

In other words, not only does this structure make it possible to increase the avalanche capability of the element, it also makes it possible to implement a low on-resistance by reducing the size of the element.

The present invention has been described above with reference to typical embodiments thereof, but it should be obvious that this invention is not limited thereto and it can equally well be applied to insulated-gate bipolar transistors (IGBTs) and other MOS-gate semiconductor devices.

Furthermore, the above embodiments related to a structure in which the body region was not exposed, by forming the source region in the body region, but the present invention is not limited thereto. For example, a structure can be used in which the surface of the body region is covered by another layer such as an insulated film. In addition, the body contact region was formed of a layer formed by doping a semiconductor layer with a high concentration of an impurity, but this invention is not limited thereto and other contact structures can also be used therefor.

The above embodiments concerned n-channel semiconductor devices, but this invention can be applied in a similar manner to p-channel semiconductor devices.

What is claimed is:

1. An insulated-gate semiconductor device for controlling the formation of a channel in a channel formation region by a voltage applied to an insulated gate, said insulated-gate semiconductor device comprising:

a semiconductor substrate;

a first semiconductor layer of a first conductivity type formed on a surface of said semiconductor substrate;

a second semiconductor layer of a second conductivity type provided in said first semiconductor layer and forming a body region, where said channel formation region is formed within part of said body region;

a third semiconductor layer of said first conductivity type, provided in said second semiconductor layer and forming a source region; and a contact region in electrical contact with said second semiconductor layer and said third semiconductor layer;

wherein said contact region is formed in a region except an active region.

2. The insulated-gate semiconductor device as defined in claim 1, further comprising a non-active region provided between said active region and said contact region to operate a parasitic bipolar transistor in accordance with a voltage drop generated by a breakdown current in said non-active region.

3. The insulated-gate semiconductor device as defined in claim 2, wherein said non-active region is covered on a surface by the same layer as said third semiconductor layer.

4. The insulated-gate semiconductor device as defined in claim 1, wherein said active region is located adjacent to said contact region to operate a parasitic bipolar transistor in accordance with a voltage drop generated by a breakdown current in said active region.

5. The insulated-gate semiconductor device as defined in claim 1, wherein said contact region is formed of an impurity diffusion layer comprising a high concentration of an impurity of said second conductivity type.

6. The insulated-gate semiconductor device as defined in claim 1, wherein said insulated-gate semiconductor device is a power metal-oxide-semiconductor field-effect transistor (MOSFET).

7. The insulated-gate semiconductor device as defined in claim 6, wherein said power MOSFET is a vertical power MOSFET having a trench gate structure.

8. The insulated-gate semiconductor device as defined in claim 6, wherein said power MOSFET is a vertical power MOSFET having a planar gate structure.

9. The insulated-gate semiconductor device as defined in claim 6, wherein said power MOSFET is a lateral power MOSFET having a planar gate structure.

10. The insulated-gate semiconductor device as defined in claim 6, wherein said power MOSFET is a vertical power MOSFET having a planar gate structure and a planar up-drain structure which is a drain region formed in said first semiconductor layer.

11. The insulated-gate semiconductor device as defined in claim 1, wherein said insulated-gate semiconductor device is an insulated-gate bipolar transistor (IGBT).

* * * * *